United States Patent [19]

Rodov

[11] 4,138,280

[45] Feb. 6, 1979

[54] METHOD OF MANUFACTURE OF ZENER DIODES

[75] Inventor: Vladimir Rodov, Los Angeles, Calif.

[73] Assignee: International Rectifier Corporation, Los Angeles, Calif.

[21] Appl. No.: 874,416

[22] Filed: Feb. 2, 1978

[51] Int. Cl.² ............................................. H01L 21/223
[52] U.S. Cl. ...................................... 148/186; 148/187; 148/189
[58] Field of Search .......................... 148/186, 187, 189

[56] References Cited

U.S. PATENT DOCUMENTS

| 2,827,436 | 3/1958 | Bernski | 148/186 X |
| 2,937,963 | 5/1960 | Pelfrey | 148/186 X |
| 3,340,598 | 9/1967 | Hatcher | 148/1.5 X |
| 3,349,474 | 10/1967 | Rauscher | 148/189 X |
| 3,453,154 | 7/1969 | Wycislak | 148/186 |
| 3,602,778 | 8/1971 | Ura et al. | 148/1.5 X |
| 3,635,773 | 1/1972 | Thire | 148/186 X |
| 3,878,001 | 4/1975 | Olk | 148/186 |
| 3,933,527 | 1/1976 | Tarneja et al. | 148/186 X |
| 4,013,483 | 3/1977 | Nuzillat et al. | 148/1.5 |
| 4,046,608 | 9/1977 | Iseghem et al. | 148/188 |

Primary Examiner—G. Ozaki
Attorney, Agent, or Firm—Ostrolenk, Faber, Gerb & Soffen

[57] ABSTRACT

A method of manufacture of a zener diode with a given breakdown voltage is disclosed wherein the resistivity of the initial wafer is measured before diffusion of a junction in the wafer, and a diffusion operation is then performed to diffuse the junction at a fixed diffusion temperature and for a time which is determined such that the desired breakdown voltage is proportional to the product of the square root of the initial resistivity and the fourth root of the diffusion time.

10 Claims, 5 Drawing Figures

METHOD OF MANUFACTURE OF ZENER DIODES

BACKGROUND OF THE INVENTION

This invention relates to the manufacture of semiconductor devices such that a given reverse avalance bulk breakdown voltage across a p-n junction can be accurately reproduced in the manufacturing process, and more specifically relates to a novel process for the manufacture of a zener diode wherein the reverse breakdown voltage of the device can be held within narrow tolerances during the manufacturing operation.

Processes for the manufacture of zener diodes are well known, and are described in numerous prior publications including, for example, U.S. Pat. No. 3,378,915, dated Apr. 23, 1968.

Zener diodes have an accurately defined reverse breakdown voltage and this characteristic is widely used in various electrical circuits. Zener diodes are normally sold with a given reverse voltage breakdown to within a tolerance of plus or minus 5%. Thus, the manufacturing operation must be closely controlled to avoid too high a rejection rate.

The actual breakdown voltage of a given device will be determined by the depth of the junction, and by the resistivity of the wafer materials. These characteristics in turn are controlled by the initial resistivity of the wafer, the diffusion temperature, and the diffusion time for a given diffusion system using given n-type or p-type conductivity materials. Consequently, the breakdown voltage of devices being produced will vary with changes in any of the above parameters.

BRIEF DESCRIPTION OF THE INVENTION

In accordance with the invention, a novel manufacturing process is provided for zener-type junctions, in which diffusion temperature is fixed and the diffusion time is very accurately controlled in accordance with a fourth root law wherein:

$$V = k\sqrt{\rho}\sqrt[4]{T}$$

where:
 V = Zener breakdown voltage;
 k = constant;
 p = resistivity of the wafer prior to diffusion;
 T = total diffusion time.

The above relationship, which is newly discovered, reveals that the ultimate breakdown voltage produced is proportional to the fourth root of diffusion time during the manufacturing process. The relation also reveals that if one tries to change both diffusion temperature (which is contained in the constant k in the novel relation of the invention, and is held constant in accordance with the invention) and diffusion time during the process, the process becomes virtually uncontrollable.

The relation also reveals that if the resistivity of the initial wafer material varies only slightly, the diffusion time must be greatly changed to obtain a given breakdown voltage. This is particularly important since semiconductor crystals are commonly sold to device manufacturers with resistivity tolerances of plus or minus 10%.

For example, the process may begin with p-type monocrystalline silicon wafers having a resistivity in the range of 0.07 to 0.095 ohm cm. An n-type region is then diffused into the p-type wafer. The final breakdown voltage, however, will vary widely if the same process parameters are used for initial 0.07 ohm cm. material as for the 0.095 ohm cm. material; and will vary uncontrollably if one tries to control the process by modifying diffusion temperature and other parameters.

In carrying out the invention, the resistivity of one or more pilot wafers is measured, and the devices are diffused under fixed temperature conditions until a device is made with the requisite breakdown voltage, say 34 volts. This then allows the determination of the constant k in the novel relationship:

$$V = k\sqrt{\rho}\sqrt[4]{T}$$

For example, if, after 55 hours of diffusion at a given time and under given diffusion conditions, and using a material measured to be 0.079 ohm cm., one produces a device with a 34.5 volt reverse-voltage breakdown, then from the above equation:

$$34.5 = k\sqrt{0.079}\sqrt[4]{55}.$$

If the next wafers to be diffused to form 34.5 volt zeners have a resistivity of 0.096 ohm cm., the diffusion time $T_x$ needed for the wafer can be calculated from:

$$34.5 = k\sqrt{0.079}\sqrt[4]{55},$$
$$34.5 = k\sqrt{0.096}\sqrt[4]{T_x}$$

$$\text{or } \sqrt[4]{T_x} = \frac{\sqrt{0.079} \times \sqrt[4]{55}}{\sqrt{0.096}},$$

and $T_x \approx 37.24$ hours.

Thus, the single process variable of diffusion time $T_x$ can now be calculated from the initial wafer resistivity, and the process will produce devices with reproducible reverse bulk avalance breakdown characteristics within a tolerance of plus or minus 5%. Note in the above example that a drastically different diffusion time is needed for 0.096 ohm cm. material than the 55 hours for the 0.079 ohm cm. material to obtain the same breakdown voltage.

Stated differently, and in accordance with the invention, if the resistivity of the initial wafer is changed from $\rho_1$ to $\rho_2$, the diffusion time $T_1$ of the initial wafer at constant temperature must change from $T_1$ to $T_2$, where $T_2 = (\rho_1/\rho_2)^2 T_1$.

DETAILED DESCRIPTION OF THE DRAWINGS

Figure 1:
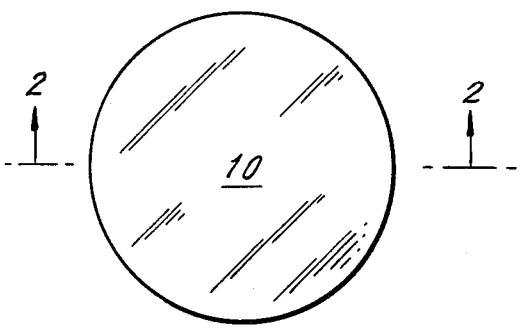
FIG. 1 is a plan view of a monocrystalline silicon wafer which is to be processed to produce a zener diode.
Figure 2:
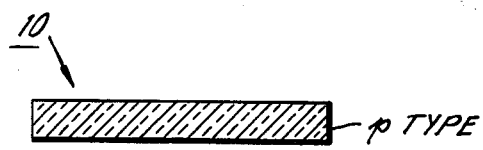
FIG. 2 is a cross-sectional view of FIG. 1 taken across section line 2—2 in FIG. 1.

Referring first to FIGS. 1 and 2, there is shown a monocrystalline silicon wafer which may have a thickness of 13 mils and a diameter of 1 inch. One or more devices are to be made from this wafer. In the following, the invention is illustrated for the case of a zener diode having a reverse voltage of 34.5 volts, plus or minus 1.5 volts. However, the invention will be understood to be applicable to the reproducible production of any given bulk avalanche breakdown voltage (in the range from approximately 10 volts to 100 volts) for any junction in a silicon semiconductor body.

The wafer 10 of FIGS. 1 and 2 is typically available with any required resistivity within about a 15% range and with any desired impurity type. For the example described herein the wafer 10 is a p-type wafer having a resistivity in the range of 0.07 ohm cm. to 0.095 ohm cm.

Figure 3:
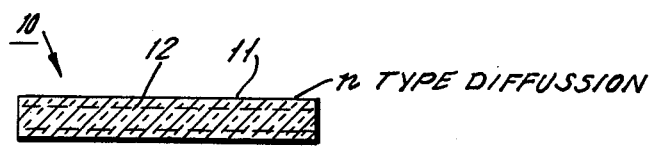
FIG. 3 shows the wafer of FIG. 2 after a diffusion step.
Figure 4:
FIG. 4 shows the wafer of FIG. 3 after the bottom surface has been lapped.
Figure 5:
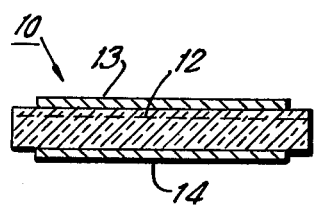
FIG. 5 shows the wafer of FIG. 4 after electrodes have been attached thereto.

In order to form the zener diode, the wafer 10 is placed in a suitable diffusion furnace and an n-type impurity, such as phosphorus, is diffused into the wafer to form the thin n-type conductivity shell 11 of FIG. 3 which creates the p-n junction 12. Any other diffusion process could be used, including but not limited to vapor phase deposition processes. After the zener diode is completed, it is provided with suitable electrodes 13 and 14, as shown in FIG. 5.

The present invention is directed to a novel process for producing the junction in a plurality of devices 12 such that they have highly reproducible reverse-voltage breakdown characteristics. In particular, the present invention is based on the discovery that if diffusion temperature is held constant, the breakdown voltage can be described with high accuracy, by the following relation:

$$V = k \sqrt{\rho} \sqrt[4]{T} \qquad (1)$$

where:
V is breakdown voltage;
$\rho$ is the resistivity of wafer 10 of FIGS. 1 and 2 before the diffusion step;
T is the total diffusion time;
k is the constant.

This approximate equation holds very well for breakdown voltages in the range of 10 volts to 100 volts.

Equation (1) is derived as follows:
The breakdown voltage V is known to be (for a gradual junction):

$$V \approx \sqrt{\frac{1}{\text{grad } N_d/X_1}} \qquad (2)$$

where $N_d$ is the concentration of donor atoms in the semiconductor body, and $X_1$ is the depth of the junction 12 into body 10.

The following approximation is used for the concentration of donor atoms at any depth in the wafer $N_{d(X)}$:

$$N_{d(x)} = N_o e^{-\frac{X}{\sqrt{DT}}} \qquad (3)$$

where:
$N_o$ is the surface concentration of donor atoms;
X is the distance into the surface of the semiconductor body;
D is the diffusivity of the donor atoms; and
T is the total diffusion time.

The concentration of acceptor atoms at the depth $X_1$ is $N_{a(X_1)}$, and is:

$$N_{a(X_1)} = N_o e^{-\frac{X_1}{\sqrt{DT}}} \qquad (4)$$

It follows from equation (4) that $$\text{grad } N_a/X_1 = -\frac{N_o}{\sqrt{DT}} e^{-\frac{X_1}{\sqrt{DT}}} \qquad (5)$$

and therefore from equations (4) and (5):

$$\text{grad } N_a/X_1 = -\frac{N_a}{\sqrt{DT}}. \qquad (6)$$

Combining equations (2) and (6), $$V \approx \frac{\sqrt[4]{DT}}{\sqrt{N_a}}. \qquad (7)$$

Since $\rho \approx 1/N_a \qquad (8)$ and since D is a constant if diffusion temperature is constant, combining (7) and (8) gives equation (1):

$$V = k \sqrt{\rho} \sqrt[4]{T}$$

In accordance with the present invention, the diffusion temperature is kept constant, for example, 1230° C., for the total diffusion time T. Note that diffusion time is measured from the time the wafers enter the diffusion furnace until the temperature starts to decline with a cooling rate about 2° C./min. The warm-up and cool-down times need not be considered if they are not considered in the calibrating procedure which is used to account for the proportionality factor k.

When using the process of the invention, and in order to take into account the proportionality factor k, wafers of a measured resistivity $\rho$ are processed in the equipment, using a fixed diffusion temperature and using a given diffusion process.

The apparatus can then be used to process subsequent wafers, changing only the diffusion time T in accordance with the measured resistivity $\rho$ of the wafers being processed. Thus, in one example, it was found that a wafer 10 having a resistivity of 0.079 ohm cm. produced a 34.5 volt junction after 55 hours of diffusion. A new wafer sample having a resistivity of 0.096 ohm cm., but being otherwise similar to the original wafer can then be directly processed in the same diffusion apparatus, where, however, the diffusion time $T_x$ is changed by the amount determined from:

$$34 = k \sqrt{0.079} \sqrt[4]{55},$$
$$34 = k \sqrt{0.096} \sqrt[4]{T_x}$$

$$T_x = 55 \cdot \left(\frac{0.079}{0.096}\right)^2 \approx 37.24.$$

In the above example, a typical wafer 10 having the resistivity 0.079 ohm cm. may have an initial thickness of 13 to 14 mils. This wafer is etched to remove about 3 mils and to polish the surface. Thereafter, a layer of phosphorus is deposited on the surface of the wafer until the sheet resistance of the surface is about 0.3 ohms. Thereafter, the temperature is increased to 1230° C. and is maintained at that temperature for 55 hours. The final device has a zener voltage of 34.5 volts.

In carrying out the present invention, it will be understood that the processing of the devices is conventional, except that the diffusion temperature is calculated as described above, and diffusion temperature is kept constant. The process can also be applied to multiple junction devices having at least one zener diode junction therein and any desired donor and acceptor atom can be used.

Although a preferred embodiment of this invention has been described, many variations and modifications will now be apparent to those skilled in the art, and it is preferred therefore that the instant invention be limited not by the specific disclosure herein but only by the appended claims.

I claim:

1. The process of manufacture of a zener diode having a predetermined reverse voltage (V) comprising the steps of measuring the resistivity ($\rho$) of a semiconducting body which is to receive a zener diode junction therein, and diffusing impurity atoms into said body at a constant temperature and for a time (T) where said time (T) is determined from the relation:

$$V = k\sqrt{\rho}\sqrt[4]{T}$$

where k is a constant.

2. The process of claim 1 wherein said body is initially of a p-type conductivity and wherein said impurity atoms diffused into said body are donor type atoms.

3. The process of making a p-n junction in a semiconductor body, which junction has a predetermined breakdown voltage within plus or minus about 5%, comprising the steps of measuring the resistivity of the semiconducting body before the formation of said p-n junction; and then diffusing impurity atoms into said body at a constant temperature for a controlled length of time such that said predetermined breakdown voltage is proportional to the product of the square root of the measured resistivity and the fourth root of the diffusion time.

4. The process of making a p-n junction in a semiconductor body which has a predetermined breakdown voltage within plus or minus about 5%, comprising the steps of measuring the resistivity of the semiconducting body before the formation of said p-n junction; and then diffusing impurity atoms into said body at a constant temperature and varying the diffusion time such that:

$$\sqrt[4]{T} = (V/k\sqrt{\rho})$$

where T is diffusion time, V is said predetermined breakdown voltage, $\rho$ is said resistivity, and k is a constant.

5. The process of claim 1 wherein said constant k is determined by processing semiconducting bodies of pre-measured resistivities for measured times T until a device is produced having said predetermined reverse voltage V wherein said last-mentioned device had an initial measured resistivity $\rho_1$ and was diffused for a measured time $T_1$.

6. The process of claim 5 wherein the diffusion time $T_x$ for subsequently produced wafers made by the same process apparatus which produced said device is determined by measuring their resistivities $\rho_x$ and by determining their diffusion time $T_x$ from the relation:

$$T_x = (\rho_1/\rho_x)^2 T_1.$$

7. The process of claim 4 wherein said constant k is determined by processing semiconducting bodies of pre-measured resistivities for measured times T until a device is produced having said predetermined reverse voltage V and which had an initial resistivity $\rho_1$ and was diffused for a time $T_1$.

8. The process of claim 7 wherein the diffusion time $T_x$ for subsequently produced wafers is determined by measuring their resistivities $\rho_x$ and by determining their diffusion times $T_x$ from the relation:

$$T_x = (\rho_1/\rho_x)^2 T_1.$$

9. The process of producing a zener diode having a given reverse breakdown voltage V within a given tolerance range; said process comprising the steps of measuring the resistivity $\rho_1$ of a first wafer of monocrystalline semiconductor material, and diffusing a junction into said first wafer at a constant temperature and for a time $T_1$ sufficient to produce the reverse breakdown voltage V; and thereafter measuring the resistivity $\rho_2$ of a second wafer of monocrystalline material, and diffusing a junction into said second wafer at said constant temperature and for a time $T_2$ to produce said reverse breakdown voltage V in said second wafer, where the time $T_2$ is determined by:

$$T_2 = (\rho_1/\rho_2)^2 T_1.$$

10. The process of manufacture of a zener diode having a given breakdown voltage wherein a junction is diffused into wafers of semiconductor material at constant temperature for a given diffusion time and wherein, when the initial resistivity of wafers being diffused is changed from $\rho_1$ to $\rho_2$, the diffusion time $T_1$ used to diffuse wafers of resistivity $\rho_1$ is changed to a time $T_2$ wherein:

$$T_2 = (\rho_1/\rho_2)^2 T_1.$$

* * * * *